United States Patent [19]

Fujiyama

[11] Patent Number: 4,646,681
[45] Date of Patent: Mar. 3, 1987

[54] GASEOUS PHASE METHOD ACCUMULATED FILM MANUFACTURING APPARATUS

[75] Inventor: Yasutomo Fujiyama, Tokyo, Japan

[73] Assignee: Canon Kabushiki Kaisha, Tokyo, Japan

[21] Appl. No.: 727,225

[22] Filed: Apr. 25, 1985

[30] Foreign Application Priority Data

May 1, 1984 [JP] Japan .................................. 59-88063

[51] Int. Cl.⁴ .............................................. C23C 13/08
[52] U.S. Cl. ..................................... 118/730; 118/715; 118/50.1; 118/729; 414/217
[58] Field of Search ............... 118/723, 727, 719, 729, 118/733, 50.1, 715, 730; 414/217

[56] References Cited

U.S. PATENT DOCUMENTS

| | | | |
|---|---|---|---|
| 2,551,389 | 5/1951 | Oliver | 118/733 |
| 2,730,987 | 1/1956 | Nelson | 118/729 |
| 3,404,661 | 10/1968 | Mathias et al. | 118/719 |
| 4,100,879 | 7/1978 | Goldin | 118/727 X |
| 4,226,208 | 10/1980 | Nishida et al. | 118/706 |
| 4,514,275 | 4/1985 | Shimada et al. | 118/50.1 |

Primary Examiner—Richard Bueker
Attorney, Agent, or Firm—Fitzpatrick, Cella, Harper & Scinto

[57] ABSTRACT

A gaseous phase method accumulated film manufacturing apparatus has one or more reaction furnace installation device on which a plurality of reaction furnaces for forming an accumulated film on a substrate by the gaseous phase method are movably installed, and one or more substrate conveying unit for conveying the substrate to the reaction furnaces.

29 Claims, 7 Drawing Figures

GASEOUS PHASE METHOD ACCUMULATED FILM MANUFACTURING APPARATUS

BACKGROUND OF THE INVENTION

1. Field of the Invention

This invention relates to a gaseous phase method accumulated film manufacturing apparatus, and more particularly to a gaseous phase method accumulated film manufacturing apparatus for forming a photoconductive film, a semiconductor film, an inorganic insulating film, an organic resin film or the like on a substrate by the plasma CVD method and which is capable of manufacturing various kinds of products by one production line.

2. Description of the Prior Art

As typical ones of apparatuses for causing a photoconductive film, a semiconductor film, an inorganic insulating film, an organic resin film or the like to be accumulated on a substrate by the plasma CVD method, mention may be made of so-called coaxial cylinder type and parallel flat plate type accumulated film manufacturing apparatuses.

The coaxial cylinder type accumulated film manufacturing apparatus is an apparatus which is capable of accumulating, for example, a non-crystalloid silicon photosensitive film on a cylindrical metal substrate formed of aluminum or the like and forming a photosensitive drum for electrophotography, and the construction thereof is such that the cylindrical substrate and a cylindrical cathode electrode sharing the center axis with the substrate are disposed so that glow discharge is caused to occur therebetween.

An example of such apparatus will hereinafter be described by reference to FIG. 2 of the accompanying drawings which is a longitudinal cross-sectional view thereof. Reference numeral 21 designates a cylindrical cathode electrode which shares the center axis with a cylindrical substrate (anode electrode) 22. Reference numeral 23 denotes doughnut-shaped electric insulators, reference numeral 24 designates a vacuum chamber lid, reference numeral 25 denotes a high-frequency power source, reference numeral 26 designates a raw material gas discharging pipe, reference numeral 27 denotes a vacuum exhaust pipe, reference numeral 28 designates a heater for heating the substrate, reference numeral 29 denotes a substrate rotating mechanism, and reference numeral 30 designates the each.

In this apparatus, one substrate is disposed for one reaction furnace, and this leads to an advantage that the adjustment of the distribution of the non-crystalloid silicon accumulated film is easy, for example, by the flow or distribution of gas and moreover the apparatus is excellent in stability of discharge.

On the other hand, the parallel flat plate type accumulated film manufacturing apparatus uses, as a pair of opposed electrodes, flat plates disposed parallel to each other, instead of the above-described two cylinders sharing the center axis, and has a structure as shown in the transverse cross-sectional view of FIG. 3 of the accompanying drawings.

In this example, glow discharge is caused to occur between a planar cathode electrode 31 and a planar substrate (anode electrode) 32, whereby an accumulated film can be formed on the substrate 32.

In these apparatuses, the spacing between the pair of opposed electrodes is in a close relation with the intensity of glow discharge and forms an important factor which governs the film thickness distribution and film characteristic of the accumulated film, and it is preferable that said spacing be kept at a proper predetermined distance to form an accumulated film of good quality.

Generally, the characteristic of the accumulated film and the size of the substrate on which the accumulated film is formed differ depending on for what usage the product after the formation of the accumulated film is used. However, where an accumulated film is to be formed on a substrate by the use of the apparatus as described above, if the apparatus is of the coaxial cylinder type, the spacing between the cylindrical substrate and the cathode electrode must be made constant as previously described, and in a reaction furnace wherein a cathode electrode of a predetermined size is provided, if a substrate different in size, particularly, in outer diameter, is disposed in the reaction furnace, the distance between the substrate and the cathode electrode does not become a predetermined distance and good film formation cannot be carried out and therefore, it has been impossible to apply substrates different in outer diameter to an apparatus.

Also, in the case of the parallel flat plate type apparatus, it is necessary that at least the cathode electrode be larger than the substrate, and further taking the matching or the like of these into account, it has been difficult to apply substrates of various shapes to a reaction furnace in which a cathode electrode of a predetermined shape is provided.

Accordingly, where accumulated films are to be mass-produced by the use of the apparatus as described above, the apparatus has unavoidably been a line exclusively for use in accord with the size of the substrate and the desired characteristic of the formed accumulated film, and above all, it has been impossible to produce numerous kinds of products by freely flowing substrates different in size.

SUMMARY OF THE INVENTION

It is an object of the present invention to provide a gaseous phase method accumulated film manufacturing apparatus which can accomplish productions of numerous kinds using substrates different in size or the like by only one line.

It is another object of the present invention to provide a gaseous phase method accumulated film manufacturing apparatus having one or more reaction furnace installation means on which a plurality of reaction furnaces for forming an accumulated film on a substrate by the gaseous phase method are movably installed, and one or more substrate conveying means for conveying the substrate to the reaction furnaces.

DESCRIPTION OF THE PREFERRED EMBODIMENTS

The apparatus of the present invention will hereinafter be described in detail with reference to the drawings.

Figure 1:
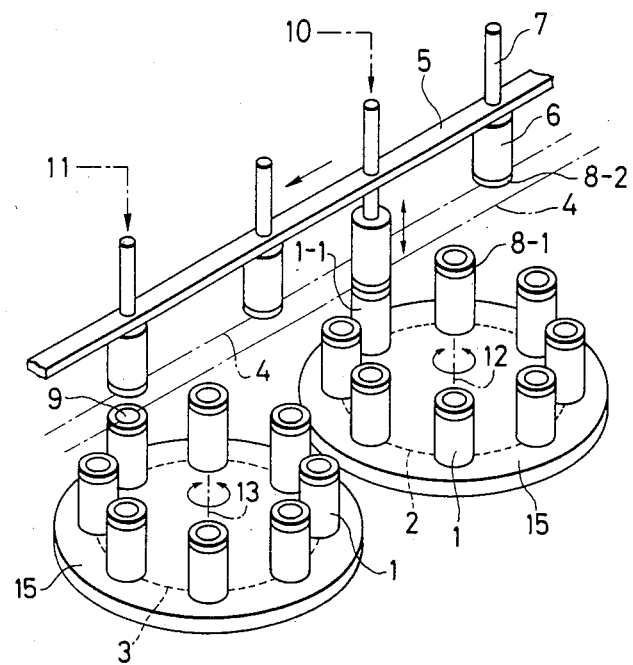
FIGS. 1, 4, 5, 6 and 7 are schematic views of the essential portions of examples of the gaseous phase method accmulated film manufacturing apparatus of the present invention.

FIG. 1 is a schematic view showing the essential portions of an example of the apparatus of the present invention.

Figure 2:
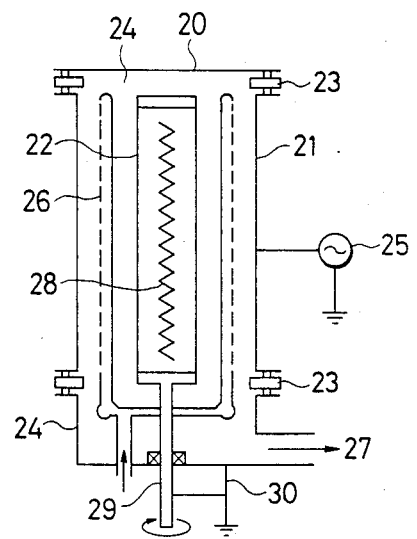
FIG. 2 is a schematic longitudinal cross-sectional view of a coaxial cylinder type accumulated film manufacturing apparatus.

In this example, reaction furnaces 1 are coaxial cylinder type reaction furnaces previously described by reference to FIG. 2, and on the upper portion of each of these reaction furnaces, a vacuum gate valve 8-1 is provided at the position of a vacuum chamber lid 24, and a cylindrical substrate (not shown) can be carried into or out of the reaction furnace 1 through this gate. The state in which the substrate has been carried into and installed in the reaction furnace 1 is similar to the state of the interior of the reaction furnace previously shown in FIG. 2.

In FIG. 1, two or more types of eight reaction furnaces 1 having different accumulated film forming functions are installed so that the center axes thereof are positioned on identical circular orbits 2, 3 and that the reaction furnaces are rotatable both leftwardly and rightwardly about the center axes 12 and 13 of the circular orbits. To install a plurality of reaction furnaces rotatably on identical circular orbits in this manner, a system for making reaction furnace installation beds 15 as reaction furnace installation means into a square or other suitable shape rotatable about a center axis or a system for making the reaction furnace installation beds 15 into a circular shape can be applied.

The reaction furnaces 1 are removably mountable on the installation beds 15, and various reaction furnaces corresponding to the desired size or the like of the substrate may be installed on the installation beds 15 as required, whereby groups of reaction furnaces different in construction can be formed on the installation beds. The number of reaction furnaces 1 on the circular orbit is not limited to eight, but may be increased or decreased as required and, if the radius of the circular orbit is correspondingly increased or decreased, efficient installation may be possible.

Accessory facilities (not shown) such as a vacuum pump, a reaction gas flow controller and a high frequency power source are connected to these reaction furnaces 1.

A conveying mechanism 5 for conveying a substrate (not shown) is provided on the tangential line 4 of the circular orbits 2, 3, and connecting positions 10 and 11 between the conveying mechanism 5 and the reaction furnaces 1 are provided at the points of contact 9 between the conveying mechanism 5 and the circular orbits 2, 3. The conveying mechanism 5 has suspended therefrom vacuum pots 6 for conveying the substrate, and a vacuum gate valve 8-2 is provided on the lower portion of each of these vacuum pots. The substrate is conveyed by being held in vacuum while being suspended within the vacuum pots 6 by a chucking mechanism, not shown.

Where the reaction furnaces 1 and the vacuum pots 6 are to be connected together at the connecting positions 10 and 11, they are connected together through the vacuum valves 8-1 and 8-2 provided on the vacuum pots and the reaction furnaces, respectively. In that case, the space between the vacuum valves 8-1 and 8-2 is evacuated to the same degree as the degree of vacuum in the vacuum pots 6 and the reaction furnaces 1 by an exhaust system, not shown, and in that state, these valves are opened and the substrate can be transferred from the vacuum pots 6 into the reaction furnaces 1 or from the reaction furnaces 1 into the vacuum pots 6 without disturbing the degree of vacuum in the vacuum pots 6 and the reaction furnaces 1.

The transfer of the substrate in the state in which the reaction furnaces 1 and the vacuum pots 6 are connected together is effected by the chuck mechanism from which the substrate is suspended, and this chuck mechanism is a mechanism which extends into the reaction furnaces and which is driven by a hydraulic cylinder to a predetermined position in the reaction furnaces, that is, so that the center axis of a cylindrical cathode electrode is coincident with the center axis of the substrute and the distance therebetween is kept at a predetermined distance and that the substrate already installed in a reaction furnace can be lifted from within the reaction furnace and again received into a vacuum pot.

To form an accumulated film by the apparatus shown in FIG. 1, a substrate of a desired shape and size is first suspended within a vacuum pot 6 by the chuck mechanism. At this time, when the substrate is to be preheated to a predetermined temperature, the substrate may be preheated and introduced into the vacuum pot or the substrate may be heated while being installed in the vacuum pot.

When the substrate has been installed in the vacuum pot 6, the vacuum gate valve 8-2 is closed, the interior of the vacuum pot 6 is evacuated to a predetermined degree of vacuum by an exhaust system, not shown. The degree of vacuum in the vacuum pot 6 is equal to the degree of vacuum in the reaction furnace 1-1 when the vacuum pot 6 and the reaction furnace 1-1 are connected together. The evacuation of the interior of the vacuum pot may also be effected during the conveyance which will now be described.

Next, the conveying mechanism 5 is operated to move the vacuum pot 5 to just above the point of contact (the connecting position 10) between the circular orbit 2 and the conveying mechanism 5 and stop it thereat. The circular orbit 2 and the conveying mechanism 5 are disposed so that at this time, the center axis of the substrate is coincident with the center axis of the reaction furnace.

Hereupon, the vacuum pot 6 is lowered by the hydraulic cylinder 7 and connected to the reaction furnace 1-1 through the vacuum gate valves 8-1 and 8-2. The space formed between the vacuum gate valves is evacuated to the same degree as the degree of vacuum in the vacuum pot and the reaction furnace by the exhaust system and, in that state, these valves are opened and the substrate is carried from the vacuum pot 6 into the reaction furnace 1-1 by the chuck mechanism without disturbing a predetermined degree of vacuum and is installed at a predetermined position. Thereafter, only the chuck mechanism is returned into the vacuum pot 6, the vacuum gate valves 8-1 and 8-2 are again closed and the space between the valves is vacuum-leaked and returned to the atmospheric pressure, whereafter only the vacuum pot 6 is lifted by the hydraulic cylinder 7 and the connection between the vacuum pot 6 and the reaction furnace 1-1 is released.

By a similar connecting operation, the substrate lying in the reaction furnace can be carried out into an empty vacuum pot. The vacuum pot from which the substrate has been carried into the reaction furnace is used to carry another substrate into and out of the reaction furnace.

The reaction furnace 1-1 into which the substrate has been carried and installed is evacuated usually to the degree of $1\times 10 - 10^{-3}$ Torr by an unshown exhaust system (which may be a commonly used exhaust system). While adjusting the flow rate and pressure thereof by a commonly used reaction gas flow rate controller (not shown), a raw material gas for forming an accumulated film and as required, a carrier gas or a doping gas for introducing impurities into the formed film may be introduced into the reaction furnaces.

For example, to form an amorphous silicon hydride film, a silane compound gas such as $SiH_4$, $Si_2H_6$, $Si_3H_8$ or $Si_4H_{10}$ or a mixture thereof and a rare gas such as $H_2$, He or Ar at a suitable ratio is introduced into the reaction furnaces. Specifically, where $SiH_4$ gas is used, the temperature of the substrate is set to 200°–400° C., a mixed gas of 5–40% by volume of $SiH_4$ gas and 95–60% by volume of $H_2$ gas is introduced into the reaction furnaces at a gas pressure of 0.1–2 Torr and at a gas flow rate of 0.1–2 l/min., a high-frequency electric power is applied from a high-frequency power source to a cathode electrode through an adjusting circuit, glow discharge is excited between the substrate and the cathode electrode and the reaction gas is decomposed, whereby an amorphous silicon hydride film can be formed on the substrate.

The gas introduced into the reaction furnaces is not limited to the above-mentioned gas, but $SiF_4$ for introducing fluorine atoms into the formed accumulated film, $B_2H_6$, $PH_3$ or $AsH_3$ for introducing p or n type impurities, $N_2$ or $NH_3$ for introducing nitrogen atoms, $N_2O$ or $NO$ for introducing oxygen atoms, a hydrocarbon compound such as ($H_4$ or $C_2H_4$) for introducing carbon atoms and a reaction gas comprising a compound containing other atoms which can be used to be contained in the accumulated film by the plasma CVD method may be mixed at a predetermined ratio by the use of a gas flow rate controller or the like and introduced into the reaction furnaces.

The apparatus of the present invention can accomplish not only the formation of such an amorphous silicon film but also the manufacture of an insulative film such as $Si_3N_4$, SiC, $SiO_2$ or SiO or an organic resin film by the use of a desired raw material gas. Where these accumulated films are to be formed in the reaction furnaces, the conditions during the formation of the films are suitably selected in accordance with the accumulated films formed.

The reaction furnace 1-1 in which the film formation by the above-described operation is taking place need not stay at the connecting position 10 between the substrate conveying mechanism 5 and the reaction furnaces 1, but is moved to other position on the circular orbit 2. While the film formation is being effected in a reaction furnace in this manner, substrates may be successively carried from the conveying mechanism into the reaction furnace newly moved to the connecting position or the substrate in the reaction furnace may be carried out therefrom.

The movement of the reaction furnaces 1 on the circular orbits 2 and 3 is controlled so that the carrying-in of the substrate at the connecting positions 10 and 11 is effected and that in a reaction furnace in which the film formation is taking place, the film formation is terminated at least when the reaction furnace has been returned to the connecting positions 10 and 11. An empty vacuum pot 6 is moved to and stopped just above the reaction furnace 1-1 in which the film formation has been terminated and which has been returned to the connecting position 10, and a substrate on which an accumulated film has been provided is carried out from the reaction furnace by an operation converse to the previously described operation for the carrying-in of the substrate.

The carried-out substrate is carried out as a product having an accumulated film of single layer construction outwardly of the manufacturing apparatus by the conveying mechanism 5, or is carried into a new reaction furnace of the same standard installed on the same circular orbit 2 and moved to the connecting position 10, whereby an accumulated film is further formed on the previously formed accumulated film to make an accumulated film of two-layer construction or an accumulated film having three or more layers is manufactured by repeating these operations, and the substrate is carried out as a product outwardly of the apparatus. Thus, in the apparatus of the present invention, where an accumulated film of multi-layer construction is to be formed, the formation of respective accmulated films can be accomplished by the use of reaction furnaces exclusively for use for the formation of individual films, and the setting of the proper operating conditions in efficient film formation can be accomplished and the contamination by the mixing of the residual amount of the gas used during the formation of other layers with the accumulated film can be prevented.

During this carrying of the substrate out of the apparatus, the vacuum pot containing the substrate therein is moved to a predetermined location by the conveying mechanism and is vacuum-leaked thereat and the interior of the pot is rendered to the same pressure as the atmospheric pressure, whereupon the vacuum gate valve is opened and the substrate on which an accumulated film as a product has been formed is taken out.

An example of the apparatus of the present invention shown in FIG. 1 has been described chiefly about the group of reaction furnaces around the center axis 12, and the operation of the group of reaction furnaces around the center axis 13 is similar to what has been described above. The number of groups of reaction furnaces are not limited to two as shown in FIG. 1, but may be one.

In this manner, in the apparatus of the present invention, it has become possible to freely select and combine a substrate and a reaction furnace in accordance with the different kind of product to be manufactured and efficiently manufacture an accumulated film by a single production line.

In the apparatus of the present invention, as shown in FIG. 1, two or more groups of reaction furnaces may be installed on identical circular orbits and the number and kinds of the reaction furnaces provided in the apparatus may be increased, and by the above-described steps in each group of reaction furnaces, more kinds of accumulated films can be formed more efficiently. Also, an accumulated film of multi-layer construction can be formed while a substrate is moved between the groups of reaction furnaces. In this example, the substrate conveying mechanism is provided on the tangential line of the circular orbit on which the reaction furnaces are installed, whereas this is not restrictive, but for example, the substrate conveying mechanism may be installed on the normal to the circular orbit and further need not always be straight but may assume one of various shapes in accordance with the form of the apparatus.

Figure 4:
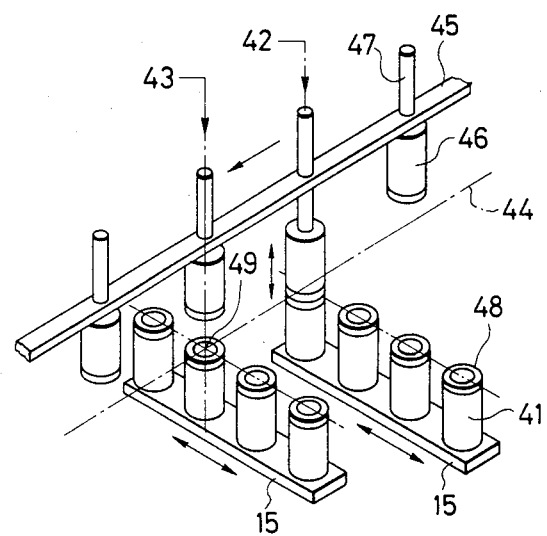

In the example of the apparatus of the present invention described above by reference to FIG. 1, the groups of reaction furnaces are installed on circular orbits, whereas the arrangement of the groups of reaction furnaces is not restricted thereto, but various arrangements are applicable. As an example of such arrangements, mention may be made of an example in which, as shown in FIG. 4, the center axes of respective reaction paths constituting groups of reaction furnaces are disposed so as to be on straight lines. The operation of each portion in this example is similar to that in the previous example using circular orbits, except that the reaction furnaces are moved in the direction of arrangement of the reaction furnace group to which these reaction furnaces belong.

Figure 5:
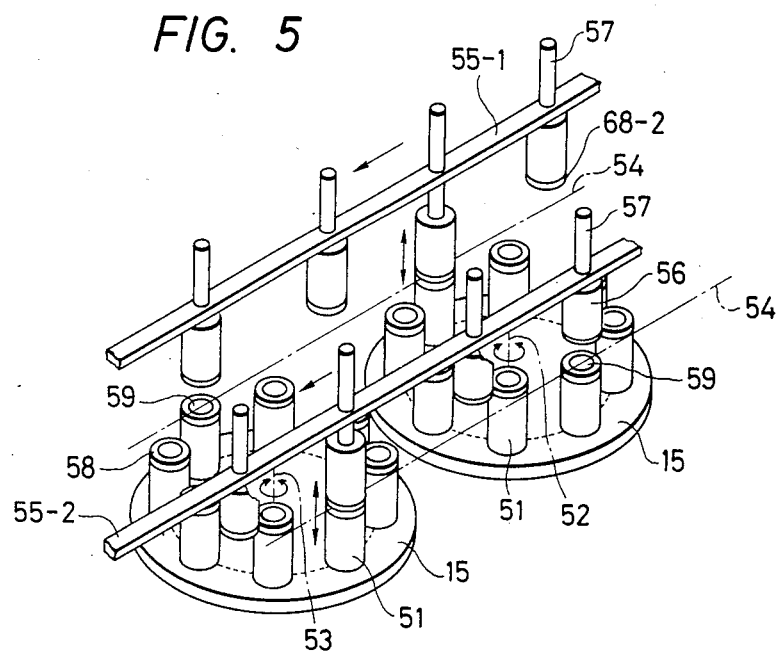
Figure 6:
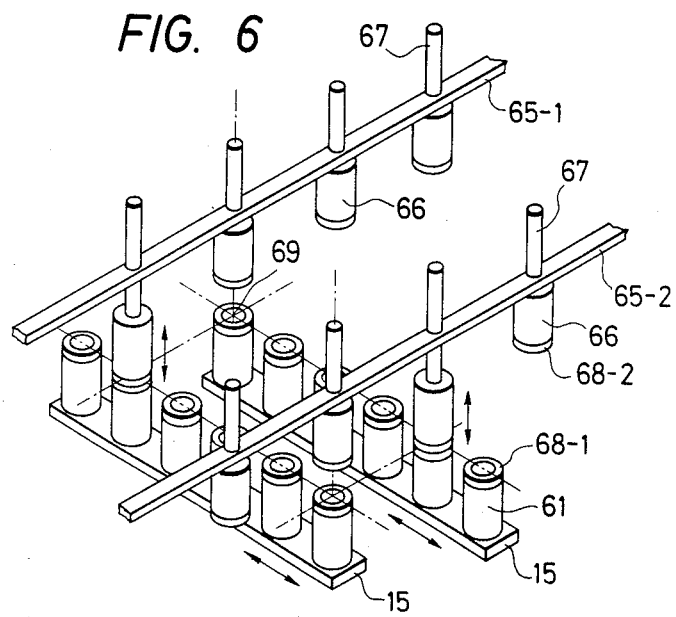

Further, in these examples of the apparatus of the present invention, only a single substrate conveying mechanism is provided, but two or more substrate conveying mechanisms may also be provided to more efficiently accomplish the carrying of the substrate into and out of the reaction furnaces and the carrying of the product out of the apparatus. As such a construction, mention may be made of the constructions as shown in FIGS. 5 and 6 wherein two substrate conveying mechanisms are provided and the conveyance of the substrate into the reaction furnaces is effected by the conveying mechanism 55-1, 65-1 and the substrate after the formation of a film thereon is carried out by the conveying mechanism 55-2, 65-2.

Figure 7:
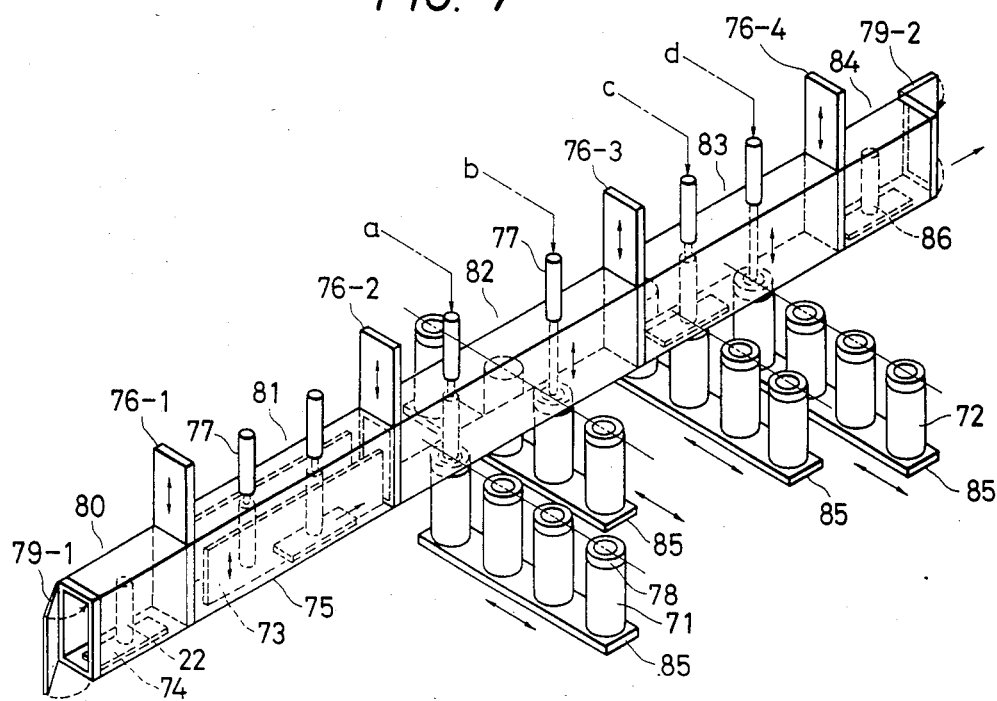

FIG. 7 is a schematic view of another example of the gaseous phase method accumulated film manufacturing apparatus of the present invention. This apparatus can continuously effect the steps of heating a substrate, forming an accumulated film on the substrate and cooling the product, and is comprised of a substrate carrying-in portion 80, a substrate heating portion 81, a film forming portion 82, a cooling portion 83 and a product carrying-out portion 84.

The operation of this apparatus of the present invention will hereinafter be described.

First, a substrate 22 corresponding to a desired product is installed from a substrate carrying-in door 79-1 provided in the substrate carrying-in portion 80 onto a conveyance loader 74 movable in a substrate conveying mechanism 75 with a gate 76-1 being closed. Subsequently, the interior of the substrate carrying-in portion 80 is evacuated to a predetermined degree of vacuum, i.e., the same degree of vacuum as that in the substrate heating portion 81, by an exhaust system, not shown. Thereupon, the gate 76-1 is opened and the substrate conveyance loader 74 is moved and therewith, the substrate 22 is moved to the substrate heating portion 81.

The substrate carrying-in portion 80 and the substrate heating portion 81 are partitioned by the gate 76-1 as required so that the substrate 22 can be moved without disturbing the appropriate atmosphere in these portions. The substrate 22 moved to the substrate heating portion 81 is heated by a heater 73. In the example shown in FIG. 7, the substrate is heated while being suspended at a predetermined position in the heating portion 81 by a chucking mechanism 77 to which a hydraulic cylinder is connected. This heating can also be effected while the substrate is moved in the heating portion, and the substrate 22 may be heated to a predetermined temperature when it is carried out of the heating portion 82.

The heated substrate 22 is further fed to the film forming portion 82. A gate 76-2 similar to the gate 76-1 is provided between the film forming portion 82 and the heating portion 81. When the substrate 22 has arrived at a carrying-in-and-out position a with respect to reaction furnaces 71, it is stopped and lifted by the chucking mechanism 77 and removed from the conveyance loader 74. The conveyance loader 74 from which the substrate 22 has been removed at the carrying-in-and-out position a is moved in the film forming portion 82 to a substrate carrying-in-and-out position b with respect to the reaction furnaces 71 or is caused to temporarily stand by at other location. Along therewith or at the point of time whereat the substrate 22 has been lifted, a reaction furnace 71 corresponding to the substrate 22 and having the accumulated film forming function is moved to the carrying-in-and-out position a and stopped thereat. At this time, positioning of the center axis of the substrate 22 and the center axis of a cathode electrode (not shown) in the reaction furnace 71 is effected so that they are coincident with each other. A vacuum gate valve is provided at the bottom of the carrying-in-and-out position a and, at a point of time whereat the substrate 22 and the reaction furnace 71 have been disposed at this position, the carrying of the substrate 22 into the reaction furnace is effected by an operation similar to that described by reference to FIG. 1 and film formation is effected in the reaction furnace 71. During the film formation, the reaction furnace 71 is moved from the carrying-in-and-out position a to other position, and another reaction furnace corresponding to a newly conveyed substrate is moved to the carrying-in-and-out position a. At a point of time whereat film formation has been terminated, the reaction furnace 71 is returned to the carrying-in-and-out position a, and the substrate 86 on which an accumulated film is formed is again returned into the substrate conveying mechanism 75 and installed on the empty conveyance loader 74. This empty conveyance loader may be one which has initially conveyed the substrate 22 and has been caused to stand by temporarily or one which has moved through the conveying mechanism 75 while remaining empty.

Where the reaction furnace corresponding to the substrate 22 is included in the group of reaction furnaces with respect to which the carrying in and out of the substrate is possible at the carrying-in-and-out position b, the conveyance loader 74 on which the substrate 22 is installed is moved to the carrying-in-and-out position b. The operation thereafter is similar to the previously described operation. The conveyance loader 74 from which the substrate 22 has been removed at the carrying-in-and-out position b is intactly moved in the film forming portion 82 to substrate carrying-in-and-out positions c and d with respect to the reaction furnace 71 or is caused to stand by temporally at other location. The substrate 86 after the termination of film formation is disposed on the conveyance loader 74 which has initially conveyed the substrate 22 to the carrying-in-and-out position b and has been caused to stands by temporally or has moved the conveying mechanism 75 while remaining empty, or the conveyance loader 74 which has become empty at the carrying-in-and-out position a. The substrate 86 opens a gate 76-3 similar to the gate 76-1 by the conveyance loader 74 and is fed to the cooling portion 83.

At the carrying-in-and-out positions c and d in the cooling portion 83, the substrate 86 after the termination of film formation is carried into or out of a cooling vacuum tank 72 for cooling the substrate 86 or in a manner similar to the operations effected at the carrying-in-and-out positions a and b. The substrate 86 carried into the cooling vacuum tank 72 is efficiently cooled to a temperature which permits removal of the substrate. The substrate 86 cooled in the cooling portion 83 is again installed on the conveyance loader 74, opens the gate 76-4 and is transferred to the product carrying-out portion 84.

Finally, the gate 76-4 is closed, and the interior of the product carrying-out portion 84 is vacuum-leaked and the internal pressure thereof is raised to a level which can open a product carrying-out door 79-2, whereupon the product carrying-out door 79-2 is opened and the product 86 is carried out.

In this apparatus, substrates corresponding to desired products can be carried into the apparatus one after another as desired and be installed in the reaction furnaces corresponding thereto, whereby film formation can be accomplished, and accumulated films of various kinds can be manufactured by one line. Moreover, the substrates are conveyed always in vacuum by the conveyance loader and heating, film formation and cooling are continuously effected in vacuum under respective proper atmospheres and therefore, good accumulated films of various kinds can be efficiently and continuously produced.

Figure 3:
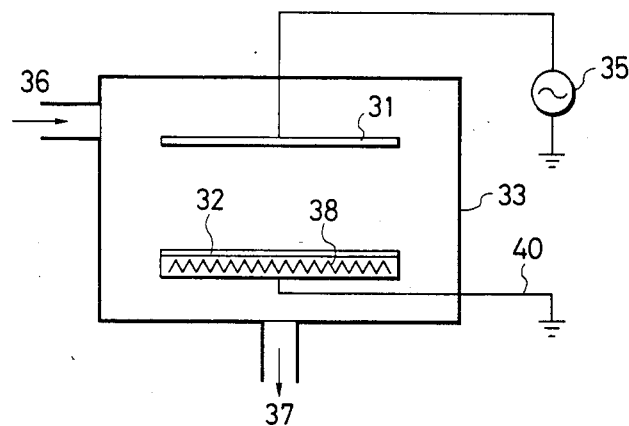
FIG. 3 is a schematic transverse cross-sectional view of a parallel flat plate type accumulated film manufacturing apparatus.

The example of the apparatus of the present invention described above uses coaxial cylinder type reaction furnaces, but it may also use the parallel flat plate type reaction furnaces as described by reference to FIG. 3 to effect film formation.

Also, in the apparatus of the present invention, by making the individual reaction furnaces removably mountable at the installation locations thereof, groups of reaction furnaces comprising a desired construction can be formed as required.

In the above-described gaseous phase accumulated film manufacturing apparatus of the present invention, one or more of groups of reaction furnaces comprising two or more types of reaction furnaces having different accumulated film forming functions and a substrate conveying mechanism are provided in one production line and these are controlled whereby film formation can be accomplished at any time in the reaction furnaces by a combination of substrates corresponding to products of various kinds, particularly individual products different in shape and size and the reaction furnaces and thus, it has become possible to mass-produce accumulated films of various kinds efficiently by one production line.

A reference example of the amorphous silicon accumulated film using the apparatus of the present invention will be shown below.

By the accumulated film manufacturing apparatus of the present invention shown in FIG. 1, an amorphous silicon accumulated film was manufactured by the use of a mixture of $SiH_4$ gas and $H_2$ gas as the raw-material gas. As the substrates, use was made of cylindrical substrates formed of high purity aluminum and having outer diameters of 80 mm and 108 mm, respectively, and four reaction furnaces of two types (the inner diameter of the cathode electrode was adjusted so that the spacing between said electrode and the substrate was 50 mm) were arranged on each of identical circular orbits.

In the reaction furnaces, the internal pressure thereof was rendered to 1 Torr and the temperature of the substrates was rendered to 300° C, whereupon $SiH_4$ gas and $H_2$ gas were introduced into the reaction furnaces at the flow rates of 400 cc/min. and 800 cc/min., respectively, while being adjusted by gas flow rate controllers so that the pressure of these gases was 0.5 Torr, and with the raw-material mixture gas being stably supplied into the reaction furnaces, a high-frequency electric power of frequency 13.56 MHz and 100 W was applied to the cathode electrode by a high-frequency power source, and glow discharge was caused to occur between the cathode electrode and an earth-installed solid, thereby causing an amorphous silicon film to be accumulated (film thickness of 25 $\mu$m) on the substrates.

One of the two types of substrates different in size was carried into the apparatus as desired, an accumulated film was formed thereon by said operation and the substrate was carried out of the apparatus. The amorphous silicon film thus manufactured was excellent in dark resistance and photoconductivity and had a uniform quality of film.

I claim:

1. A manufacturing system for accumulating a film on a substrate by a gaseous phase method comprising:
   a plurality of processing chambers for accumulating the film on the substrate by the gaseous phase method;
   a conveying means for conveying the substrate to a processing chamber or for conveying the substrate having an accumulated film from a processing chamber, and
   a moving means for moving the processing chambers to and from the conveying means; said plurality of processing chambers being mounted on the moving means.

2. A manufacturing system according to claim 1, wherein the moving means rotates around an axis, and each of the processing chambers is located around said axis at a predetermined distance from said axis and at a second predetermined distance from each other.

3. A manufacturing system according to claim 2, wherein the processing chambers are removable from the moving means.

4. A manufacturing system according to claim 3, wherein the movement of the moving means is synchronized with the movement of the conveying means.

5. A manufacturing system according to claim 4, further comprising a second or a plurality of conveying means for conveying the substrate to a processing chamber or for conveying the substrate having an accumulated film from a processing chamber.

6. A manufacturing system according to claim 1, wherein the processing chambers are removable from the moving means.

7. A manufacturing system according to claim 1, wherein the movement of the moving means is synchronized with the movement of the conveying means.

8. A manufacturing system according to claim 1, further comprising a second or a plurality of conveying means for conveying the substrate to a processing chamber or for conveying the substrate having an accumulated film from a processing chamber.

9. A manufacturing system according to claim 1, wherein one of the plurality of processing chambers is different from the other processing chambers.

10. A manufacturing system according to claim 2, wherein the movement of the moving means is synchronized with the movement of the conveying means.

11. A manufacturing system according to claim 2, further comprising a second or a plurality of conveying means for conveying the substrate to a processing chamber or for conveying the substrate having an accumulated film from a processing chamber.

12. A manufacturing system according to claim 2, wherein one of the plurality of processing chambers is different from the other processing chambers.

13. A manufacturing system according to claim 3, further comprising a second or a plurality of conveying means for conveying the substrate to a processing chamber or for conveying the substrate having an accumulated film from a processing chamber.

14. A manufacturing system according to claim 3, wherein one of the plurality of processing chambers is different from the other processing chambers 15. A manufacturing system according to claim 1, wherein the processing chambers are positioned substantially in a straight line on the moving means, and the moving means moves in the direction of the straight line.

16. A manufacturing system according to claim 15, wherein the processing chambers are removable from the moving means.

17. A manufacturing system according to claim 16, wherein the movement of the moving means is synchronized with the movement of the conveying means.

18. A manufacturing system according to claim 17, further comprising a second or a plurality of conveying means for conveying the substrate to a processing chamber or for conveying the substrate having an accumulated film from a processing chamber.

19. A manufacturing system according to claim 15, wherein the movement of the moving means is synchronized with the movement of the conveying means.

20. A manufacturing system according to claim 15, further comprising a second or a plurality of conveying means for conveying the substrate to a processing chamber or for conveying the substrate having an accumulated film from a processing chamber.

21. A manufacturing system according to claim 15, wherein one of the plurality of processing chambers is different from the other processing chambers.

22. A manufacturing system according to claim 16, further comprising a second or a plurality of conveying means for conveying the substrate to a processing chamber or for conveying the substrate having an accumulated film from a processing chamber.

23. A manufacturing system according to claim 16, wherein one of the plurality of processing chambers is different from the other processing chambers.

24. A manufacturing system for accumulating a film on a substrate by a gaseous phase method, comprising:
   a plurality of sets of processing chambers, each set containing a plurality of processing chambers for accumulating the film on the substrate by the gaseous phase method:
   a conveying means for conveying the substrate to a processing chamber or for conveying the substrate having an accumulated film from a processing chamber, and
   a plurality of moving means for moving the processing chambers to and from the conveying means; each set of processing chambers being mounted on a separate moving means.

25. A manufacturing system according to claim 24, wherein each moving means rotates around a separate axis, and each of the processing chambers of the set mounted on the moving means is located around said axis at a predetermined distance from said axis and at a second predetermined distance from each other.

26. A manufacturing system according to claim 24, wherein the processing chambers of each set are positioned substantially in a straight line on the respective moving means, and each moving means moves in the direction of the straight line.

27. A manufacturing system according to claim 24, wherein one of the plurality of processing chambers is different from the other processing chambers.

28. A manufacturing system according to claim 25, wherein one of the plurality of processing chambers is different from the other processing chambers.

29. A manufacturing system according to claim 26, wherein one of the plurality of processing chambers is different from the other processing chambers.

* * * * *

UNITED STATES PATENT AND TRADEMARK OFFICE
CERTIFICATE OF CORRECTION

PATENT NO. : 4,646,681

DATED : March 3, 1987

INVENTOR(S) : YASUTOMO FUJIYAMA

It is certified that error appears in the above-identified patent and that said Letters Patent is hereby corrected as shown below:

AT [57] IN THE ABSTRACT

Line 3,    "device" should read --devices--.
    Line 6,    "unit" should read --units--.

COLUMN 1

Line 48,   "each." should read --earth.--

COLUMN 2

Line 34,   "a line" should read --designed--.
    Line 60,   "accmulated" should read --accumulated--.

COLUMN 4

Line 17,   "rute" should read --rate--.

COLUMN 6

Line 23,   "accmulated" should read --accumulated--.

COLUMN 8

Line 60,   "stands" should read --stand--.

COLUMN 10

Line 11,   "earth-installed" should read --earth-grounded--.

UNITED STATES PATENT AND TRADEMARK OFFICE
CERTIFICATE OF CORRECTION

PATENT NO. : 4,646,681                                          Page 2 of 2

DATED      : March 3, 1987

INVENTOR(S): YASUTOMO FUJIYAMA

It is certified that error appears in the above-identified patent and that said Letters Patent is hereby corrected as shown below:

COLUMN 11

Line 16, "chambers" should read --chambers.--.

Signed and Sealed this

Twenty-ninth Day of September, 1987

Attest:

DONALD J. QUIGG

Attesting Officer     Commissioner of Patents and Trademarks